(12) United States Patent
Mu et al.

(10) Patent No.: US 12,278,104 B2
(45) Date of Patent: Apr. 15, 2025

(54) MULTI-LAYER SEMICONDUCTOR MATERIAL STRUCTURE AND PREPARATION METHOD THEREOF

(71) Applicant: INSTITUTE OF MICROELECTRONICS OF THE CHINESE ACADEMY OF SCIENCES, Beijing (CN)

(72) Inventors: Fengwen Mu, Beijing (CN); Xinhua Wang, Beijing (CN); Sen Huang, Beijing (CN); Ke Wei, Beijing (CN); Xinyu Liu, Beijing (CN)

(73) Assignee: Institute of Microelectronics of the Chines Academy of Sciences, Beijing (CN)

( * ) Notice: Subject to any disclaimer, the term of this patent is extended or adjusted under 35 U.S.C. 154(b) by 207 days.

(21) Appl. No.: 17/928,951

(22) PCT Filed: Sep. 9, 2021

(86) PCT No.: PCT/CN2021/117424
§ 371 (c)(1),
(2) Date: Dec. 1, 2022

(87) PCT Pub. No.: WO2022/121408
PCT Pub. Date: Jun. 16, 2022

(65) Prior Publication Data
US 2023/0230831 A1 Jul. 20, 2023

(30) Foreign Application Priority Data
Dec. 11, 2020 (CN) .......................... 202011461767.6

(51) Int. Cl.
*H01L 21/24* (2006.01)
*H01L 21/02* (2006.01)
*H01L 23/373* (2006.01)

(52) U.S. Cl.
CPC .. *H01L 21/02378* (2013.01); *H01L 21/02376* (2013.01); *H01L 21/0259* (2013.01); *H01L 21/02694* (2013.01); *H01L 23/3732* (2013.01)

(58) Field of Classification Search
CPC ......... H01L 21/02378; H01L 21/02694; H01L 21/02376; H01L 23/3732; H01L 21/0259
See application file for complete search history.

(56) References Cited

U.S. PATENT DOCUMENTS

| | | | |
|---|---|---|---|
| 5,373,171 | A | 12/1994 | Imai et al. |
| 2002/0038892 | A1 | 4/2002 | Otani et al. |

(Continued)

FOREIGN PATENT DOCUMENTS

CN 1564308 A 1/2005

OTHER PUBLICATIONS

Espacenet Bibliographic Data and Machine Translation for CN1564308A, dated Jan. 12, 2005, 10 pages.

(Continued)

*Primary Examiner* — Robert M Kunemund
(74) *Attorney, Agent, or Firm* — Sand, Sebolt & Wernow Co., LPA

(57) ABSTRACT

The present disclosure relates to the technical field of semiconductors. Disclosed is a multi-layer semiconductor material structure and a preparation method thereof, solving the problems of the existing semiconductor materials that have poor heat dissipation, high cost, and cannot be mass-produced. The multi-layer semiconductor material structure includes a highly thermally conductive support substrate and a crystallized device function layer, where the device function layer is provided on the highly thermally conductive support substrate, and has a single-crystal surface layer.

16 Claims, 9 Drawing Sheets

(56) References Cited

U.S. PATENT DOCUMENTS

2007/0209576 A1* 9/2007 Sunkara ................ B82Y 30/00
                                                       117/109
2014/0357053 A1  12/2014 Sun et al.
2019/0371894 A1* 12/2019 Maekawa ......... H01L 29/66068
2021/0384069 A1  12/2021 Ou et al.

OTHER PUBLICATIONS

Chinese International Search Report for PCT/CN2021/117424 dated Oct. 29, 2021, 8 pages.

* cited by examiner

MULTI-LAYER SEMICONDUCTOR MATERIAL STRUCTURE AND PREPARATION METHOD THEREOF

CROSS-REFERENCE TO RELATED APPLICATIONS

This application is a National Stage of International Application No. PCT/CN2021/117424, filed Sep. 9, 2021, which claims priority to Chinese Patent Application No. 202011461767.6, filed Dec. 11, 2020, both of which are hereby incorporated by reference in their entireties.

TECHNICAL FIELD

The present application relates to the technical field of semiconductors, and in particular to a multi-layer semiconductor material structure and a preparation method thereof.

BACKGROUND

Gallium oxide ($Ga_2O_3$) is a new type of ultra-wide bandgap semiconductor material. Compared with common third-generation semiconductor materials, $Ga_2O_3$ has a wider bandgap, a higher breakdown field strength, and a Baliga's figure of merit (BFOM) that is 4 times that of GaN and more than 10 times that of SiC. Under the same withstand voltage condition, the theoretical on-resistance of a $Ga_2O_3$-based unipolar device is only $\frac{1}{10}$ that of SiC and $\frac{1}{3}$ that of GaN. It is beneficial to reduce the turn-on loss of the power circuit, and maximize the power density of the device. In addition, the $Ga_2O_3$ single-crystal substrate can be grown by the melt method, which outperforms SiC and GaN in terms of preparation cost.

Although $Ga_2O_3$ has low preparation cost and can achieve excellent device performance, its extremely low thermal conductivity (10-25 W/m·K) will cause severe local self-heating during device operation, thereby leading to faster device degradation and shorter device life. This greatly limits the application of $Ga_2O_3$ under high power conditions, especially the thermal conductivity of $Ga_2O_3$ will be further reduced due to the size effect, doping and alloying. Therefore, one of the main challenges in realizing the wide application of $Ga_2O_3$ is to achieve effective heat dissipation thereof. At present, the research on $Ga_2O_3$ is mainly focused on the improvement of electrical performance, and only a few studies on thermal performance and thermal management have been reported. Among them, a very promising solution is the heterointegration of $Ga_2O_3$ with a highly thermally conductive substrate.

M. J. Tadjer et al. transferred (100) plane $Ga_2O_3$ nano-ribbons to a single-crystal diamond substrate by mechanical lift-off, and fabricated a $Ga_2O_3$ nano-film field effect transistor (FET). The weak van der Waals bonding between the $Ga_2O_3$ nano-film and the diamond substrate results in a very low interfacial thermal conductance (17 MW/m²·K). However, due to the ultra-high thermal conductivity of diamond, the direct current (DC) power density of the $Ga_2O_3$ device reaches 60 W/mm. The method of transferring the nano-ribbons by mechanical lift-off is only suitable for stand-alone devices, and cannot meet the requirements for mass production and large-scale application of $Ga_2O_3$ devices.

Z. Cheng et al. directly grew $Ga_2O_3$ on single-crystal diamond by atomic layer deposition (ALD) and achieved a highly thermally conductive interface between $Ga_2O_3$ and diamond. Although the atomic layer deposition method can directly grow $Ga_2O_3$ and achieve a high thermal conductivity interface, the $Ga_2O_3$ film has poor crystal quality, and it is a nano-poly-crystal structure, with a thermal conductivity close to that of amorphous $Ga_2O_3$, making it hard to use for device fabrication.

F. Mu et al. realized surface-activated room-temperature hetero-integration of a 2-inch $Ga_2O_3$ single-crystal substrate and a SiC substrate, and realized the transfer of a single-crystal $Ga_2O_3$ film by ion implantation and lift-off. The surface-activated room-temperature bonding process can realize the hetero-integration of $Ga_2O_3$, but the bonding process is complicated, costly, and easy to introduce interface defects.

Therefore, there is an urgent need to develop a hetero-integration technology of $Ga_2O_3$ and highly thermally conductive substrates that can be applied on a large scale.

In addition, the materials such as silicon (Si), silicon carbide (SiC), gallium nitride (GaN), aluminum oxide ($Al_2O_3$), germanium (Ge), carbon (C), aluminum nitride (AlN), zinc oxide (ZnO), gallium arsenide (GaAs), and aluminum gallium nitride (AlGaN), also have the problem of poor heat dissipation.

SUMMARY

In view of the above analysis, the present application provides a multi-layer semiconductor material structure and a preparation method thereof to solve the problems of the existing semiconductor materials that have poor heat dissipation, high cost, and cannot be mass-produced.

The objective of the present application is achieved by the following technical solutions.

An aspect of the present application provides a multi-layer semiconductor material structure. The multi-layer semiconductor material structure includes a highly thermally conductive support substrate and a crystallized device function layer, where the device function layer is provided on the highly thermally conductive support substrate, and has a single-crystal surface layer.

In a possible design, the device function layer may have a crystal structure, with a microstructural gradient from single-crystal to poly-crystal from a surface to an interface; and alternatively, the device function layer may have a crystal structure, with a single-crystal portion close to the surface and the interface, and a microstructural gradient from single-crystal to poly-crystal from the surface and the interface to a center.

In a possible design, the device function layer may be a single-layer structure made of one of the group consisting of gallium oxide ($Ga_2O_3$), silicon (Si), silicon carbide (SiC), gallium nitride (GaN), aluminum oxide ($Al_2O_3$), germanium (Ge), carbon (C), aluminum nitride (AlN), zinc oxide (ZnO), gallium arsenide (GaAs), and aluminum gallium nitride (AlGaN), and may have a thickness of 100 nm to 50 μm.

In a possible design, the device function layer may include a first film layer and a second film layer; the first film layer may be provided on the highly thermally conductive support substrate; and the second film layer may be provided on the first film layer;

the first film layer may be a single-layer structure made of one of the group consisting of gallium oxide ($Ga_2O_3$), silicon (Si), silicon carbide (SiC), gallium nitride (GaN), aluminum oxide ($Al_2O_3$), germanium (Ge), carbon (C), aluminum nitride (AlN), zinc oxide (ZnO), gallium arsenide (GaAs), aluminum gallium nitride (AlGaN), silicon nitride (SiN), silicon dioxide ($SiO_2$), hafnium oxide ($HfO_2$), silicon oxynitride (SiNO), silicon oxycarbide (SiCO), and aluminum oxynitride (AlON), or a multi-layer structure made of more of the group; and the first film layer may have a thickness of 100 nm to 50 µm; and the second film layer may be a single-layer structure made of one of the group consisting of gallium oxide ($Ga_2O_3$), silicon (Si), silicon carbide (SiC), gallium nitride (GaN), aluminum oxide ($Al_2O_3$), germanium (Ge), carbon (C), aluminum nitride (AlN), zinc oxide (ZnO), gallium arsenide (GaAs), and aluminum gallium nitride (AlGaN), or a multi-layer structure made of more of the group; and the second film layer may have a thickness of 100 nm to 50 µm.

In a possible design, the highly thermally conductive support substrate may be made of at least one of the group consisting of diamond, silicon carbide (SiC), aluminum nitride (AlN), boron nitride (BN), beryllium oxide (BeO), aluminum silicon carbide (AlSiC), copper tungsten (CuW), and copper molybdenum (CuMo).

Another aspect of the present application further provides a preparation method of a multi-layer semiconductor material structure, including the following steps:

forming a device function layer on a highly thermally conductive support substrate;

attaching a single-crystal substrate to a surface of the device function layer;

annealing at 300-1,800° C.; and lifting the single-crystal substrate off after cooling to obtain the multi-layer semiconductor material structure.

In a possible design, the device function layer may be formed on the highly thermally conductive support substrate by at least one means of chemical vapor deposition (CVD), atomic layer deposition (ALD), molecular beam deposition (MBD), hydride vapor phase epitaxy (HVPE), physical sputtering, and plasma-enhanced chemical vapor deposition (PECVD).

In a possible design, the device function layer may include a first film layer and a second film layer; and the forming a device function layer on a highly thermally conductive support substrate may include: depositing the first film layer with a thickness of 100 nm to 50 µm on the highly thermally conductive support substrate; planarizing and smoothing the first film layer; and depositing the second film layer with a thickness of 100 nm to 50 µm.

In a possible design, the device function layer may be a single film layer with a thickness of 100-50 µm; and the preparation method may further include: planarizing and smoothing the film layer after forming the film layer on the highly thermally conductive support substrate, and attaching a single-crystal substrate to a surface of the smoothed film layer.

In a possible design, the device function layer may be planarized and smoothed to a surface roughness of 0.1-10 nm.

Compared with the prior art, the present application can achieve most if not all of the following technical effects.

1) In the present application, the device function layer of the multi-layer semiconductor material structure is provided on the highly thermally conductive support substrate. The device function layer is a film layer that is at least partially crystallized, and its near-surface layer has a single-crystal structure. This design forms a highly thermally conductive interface, which improves the heat dissipation efficiency of the device function layer, and ensures the practicability of the device function layer. In addition, the preparation process is simple, low-cost, and can be used for large-size and batch manufacturing.

2) The multi-layer semiconductor material structure can be used to fabricate devices such as high-performance metal-oxide-semiconductor field-effect transistors (MOSFETs), high electron mobility transistors (HEMTs), or Schottky diodes with high heat dissipation capability, and is not limited to horizontal devices or vertical devices.

3) In order to enhance the interfacial adsorption force, release stress and thermal conductivity, the device function layer includes the first film layer and the second film layer. The first film layer has a thermal expansion coefficient closer to that of the highly thermally conductive substrate and a higher chemical affinity.

Other features and advantages of the present application will be described in the following specification, and some of these will become apparent from the specification or be understood by implementing the present application. The objectives and other advantages of the present application may be achieved by the structure specifically indicated in the specification and drawings.

BRIEF DESCRIPTION OF THE DRAWINGS

The drawings are provided merely for illustrating specific examples and are not considered as limiting the present application. The same reference numerals denote the same components throughout the drawings.

Figure 1:
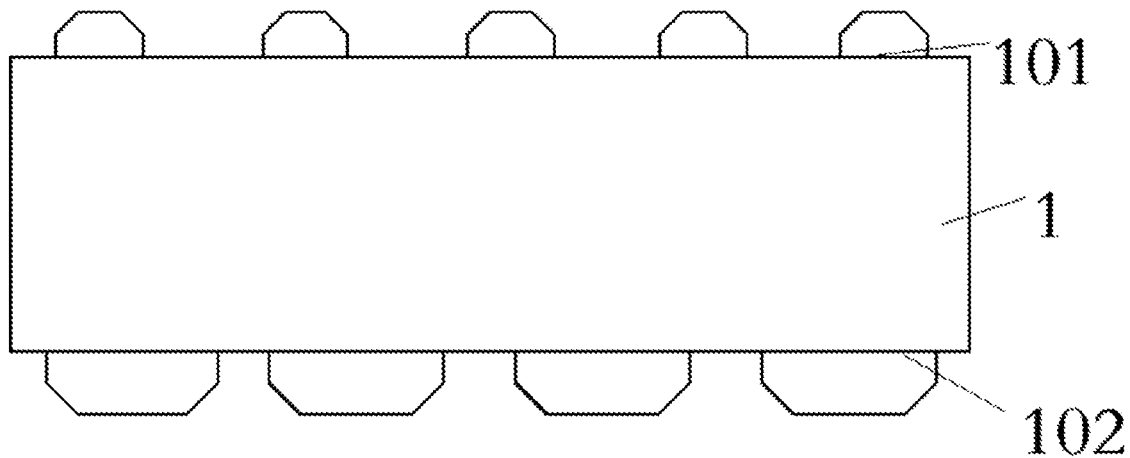
FIG. 1 is a schematic diagram of a highly thermally conductive support substrate.

REFERENCE NUMERALS 1. highly thermally conductive support substrate; 101. first surface; 102. second surface; 2. device function layer; 201. first film layer; 202. second film layer; and 3. single-crystal substrate.

DETAILED DESCRIPTION OF THE EMBODIMENTS

The embodiments of the present application are described below with reference to the drawings. It should be understood that these descriptions are merely exemplary and are not intended to limit the scope of the present application. In addition, in the following description, descriptions of conventional structures and technologies are omitted to avoid unnecessarily confusing the concepts of the present application.

Various schematic diagrams of the embodiments of the present application are illustrated in the drawings. These drawings are not drawn to scale, in which some details are enlarged to be seen clearly, and some details may be omitted. The shapes of various regions and layers shown in the drawings and relative sizes and positional relationships thereof are merely exemplary, which may be different due to manufacturing tolerances or technical limitations in practice, and those skilled in the art may additionally design regions/layers with different shapes, sizes and relative positions according to actual needs.

In the context of the present application, when a layer/element is referred to as being "on" another layer/element, it may be directly on the another layer/element, or there may be an intermediate layer/element present there-between. In addition, if a layer/element is "on" another layer/element in one orientation, the layer/element may be "under" the another layer/element when the orientation is reversed.

A multi-layer semiconductor material structure includes a highly thermally conductive support substrate 1 and a crystallized device function layer 2. The device function layer 2 is provided on the highly thermally conductive support substrate 1, and a near-surface layer of the device function layer 2 has a single-crystal structure.

A crystal structure of the crystallized device function layer 2 has a microstructural gradient from single-crystal to poly-crystal from a surface to an interface. A surface layer portion near the surface has a high-quality single-crystal structure and has a fixed orientation, such as [0001], [001], [111], [110], etc.

Compared with the prior art, in the present application, the device function layer 2 of the multi-layer semiconductor material structure is provided on the highly thermally conductive support substrate 1. The device function layer 2 is a film layer that is at least partially crystallized, and the near-surface layer of the device function layer 2 has a single-crystal structure. The multi-layer semiconductor material structure of the present application forms a highly thermally conductive interface, which improves the heat dissipation efficiency of the device function layer 2, and ensures the practicability of the device function layer 2. Therefore, the multi-layer semiconductor material structure can be used for device fabrication.

Specifically, the highly thermally conductive support substrate 1 (with a thermal conductivity greater than 100 W/m·K) is made of at least one of the group consisting of diamond, silicon carbide (SiC), aluminum nitride (AlN), boron nitride (BN), beryllium oxide (BeO), aluminum silicon carbide (AlSiC), copper tungsten (CuW), and copper molybdenum (CuMo). Its crystal form and crystal orientation are not limited, and it may be single-crystal, poly-crystal, or amorphous.

When the highly thermally conductive support substrate 1 is single-crystal, the device function layer 2 has a crystal structure, with a single-crystal portion close to the surface and the interface, and a microstructural gradient from single-crystal to poly-crystal from the surface and the interface to a center.

As shown in FIG. 1, the highly thermally conductive support substrate 1 includes a first surface 101 and a second surface 102. The first surface 101 has a roughness of less than 1000 nm. If the first surface is too rough, it will result in high cost of a subsequent process. Preferably, the second surface 102 has a roughness of 1 nm to 20 μm.

In an embodiment of the present application, the device function layer 2 is a single-layer structure made of one of the group consisting of gallium oxide ($Ga_2O_3$), silicon (Si), silicon carbide (SiC), gallium nitride (GaN), aluminum oxide ($Al_2O_3$), germanium (Ge), carbon (C), aluminum nitride (AlN), zinc oxide (ZnO), gallium arsenide (GaAs), and aluminum gallium nitride (AlGaN).

In another embodiment of the present application, in order to enhance the interfacial adsorption force, release stress and thermal conductivity, the device function layer 2 includes a first film layer 201 and a second film layer 202. The first film layer 201 has a thermal expansion coefficient closer to that of the highly thermally conductive support substrate 1 and a higher chemical affinity. It is provided on the highly thermally conductive support substrate 1, and has a thickness of 100 nm to 50 μm. The second film layer 202 is provided on the first film layer 201, and has a thickness of 100 nm to 50 μm. The first film layer 201 is a single-layer structure made of one of the group consisting of gallium oxide ($Ga_2O_3$), silicon (Si), silicon carbide (SiC), gallium nitride (GaN), aluminum oxide ($Al_2O_3$), germanium (Ge), carbon (C), aluminum nitride (AlN), zinc oxide (ZnO), gallium arsenide (GaAs), aluminum gallium nitride (AlGaN), silicon nitride (SiN), silicon dioxide ($SiO_2$), hafnium oxide ($HfO_2$), silicon oxynitride (SiNO), silicon oxycarbide (SiCO), and aluminum oxynitride (AlON), or a multi-layer structure formed by depositing more of the group separately. The second film layer 202 is a single-layer structure made of one of the group consisting of gallium oxide ($Ga_2O_3$), silicon (Si), silicon carbide (SiC), gallium nitride (GaN), aluminum oxide ($Al_2O_3$), germanium (Ge), carbon (C), aluminum nitride (AlN), zinc oxide (ZnO), gallium arsenide (GaAs), and aluminum gallium nitride (AlGaN), or a multi-layer structure formed by depositing more of the group separately.

The present application further provides a preparation method of a multi-layer semiconductor material structure, including the following steps:

Form a device function layer 2 on a highly thermally conductive support substrate 1.

Attach a single-crystal substrate 3 to a surface of the device function layer 2.

Anneal.

Lift the single-crystal substrate 3 off after cooling to obtain the multi-layer semiconductor material structure.

Figure 5:
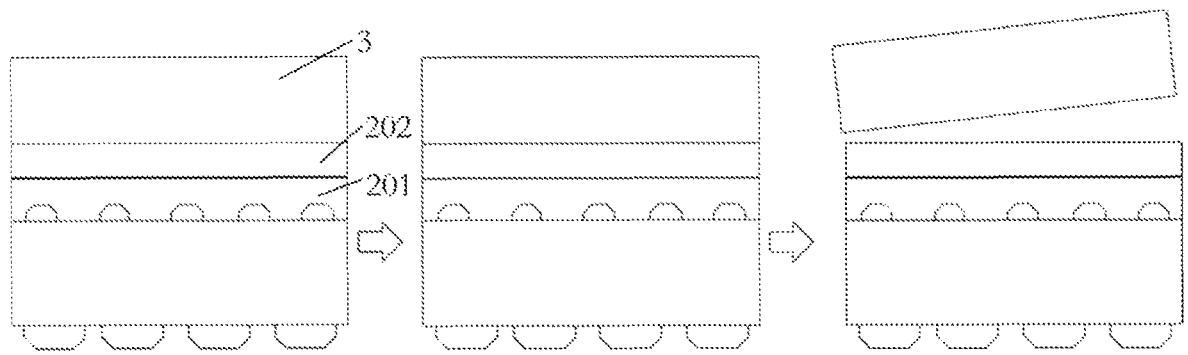
FIG. 5 is a flowchart of film layer crystallization.

As shown in FIG. 5, in the present application, the single-crystal substrate 3 with a low defect density is attached to the surface of the device function layer 2 as an initial nucleation substrate. Then, heating and annealing are performed. A surface layer of the device function layer 2 undergoes solid-phase epitaxial crystallization along a surface of the initial nucleation substrate, with an orientation consistent with that of the initial nucleation substrate. After cooling, the initial nucleation substrate (i.e. the single-crystal substrate 3) is lifted off. The crystal structure of the crystallized device function layer 2 has a microstructural gradient from single-crystal to poly-crystal from a surface to an interface, and a near-surface layer has a high-quality single-crystal structure. The preparation method of the present application is simple. The single-crystal structure is formed on the surface layer of the device function layer 2, which ensures the practicability of the device function layer 2, and can be used for device fabrication.

When the highly thermally conductive support substrate 1 is single-crystal, the same nucleation effect as the single-crystal substrate 3 attached to the surface of the device function layer 2 will be produced during annealing. At this time, the device function layer 2 has a crystal structure, with a single-crystal portion of the device function layer 2 close to the surface and the interface, and a microstructural gradient from single-crystal to poly-crystal from the surface and the interface to a center.

Exemplarily, the single-crystal substrate 3 may be made of sapphire. The single-crystal substrate 3 has a thickness of 50-1.000 μm and a surface roughness of 0.1-10 nm to ensure full contact with the surface of the device function layer 2.

The device function layer 2 is formed on the highly thermally conductive support substrate 1 by at least one means of chemical vapor deposition (CVD), atomic layer deposition (ALD), molecular beam deposition (MBD), hydride vapor phase epitaxy (HVPE), physical sputtering, and plasma-enhanced chemical vapor deposition (PECVD).

Before attaching the single-crystal substrate 3, the device function layer 2 is planarized and smoothed such that the surface roughness of the device function layer 2 is 0.1-10 nm. Specifically, the planarization and smoothing are performed by chemical mechanical polishing (CMP) and plasma treatment.

The annealing temperature is 300-1.800° C. In order to prevent a high thermal stress produced during annealing, the heating and annealing rates are not higher than 50° C./min. and the holding time is 5-100 min.

Figure 2:
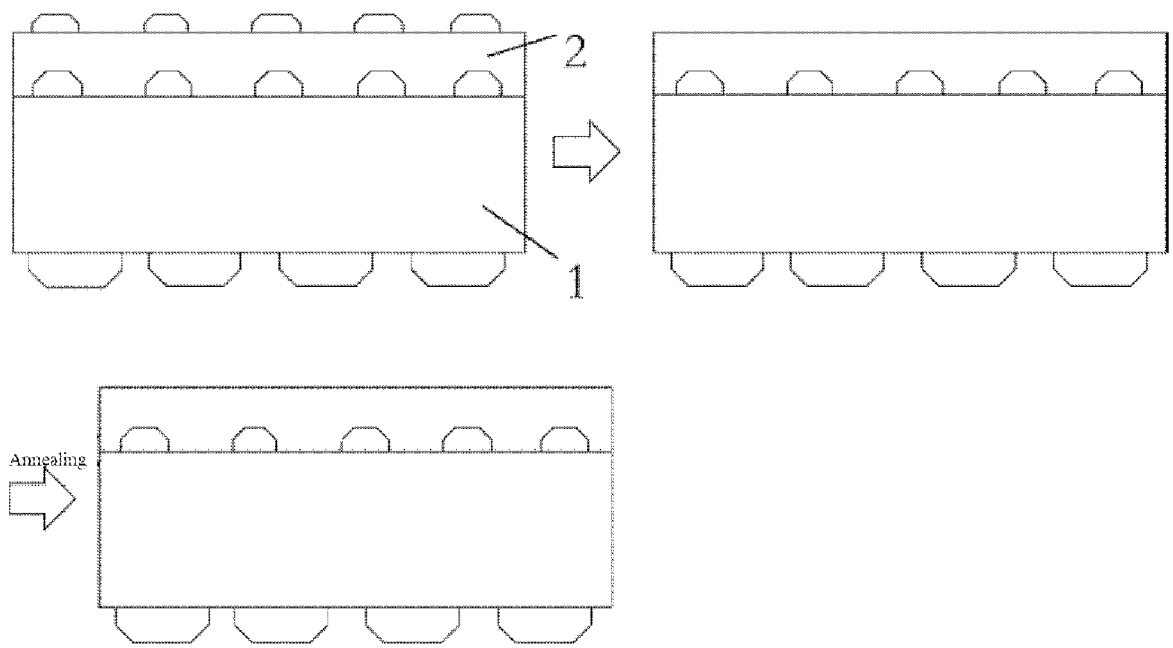
FIG. 2 is a flowchart of a preparation method of a multi-layer semiconductor material structure according to an embodiment.

In an embodiment of the present application, as shown in FIG. 2, a highly thermally conductive support substrate 1 is first provided. The device function layer 2 is deposited on a first surface 101 of the highly thermally conductive support substrate 1. It is a single-layer structure made of one of the group consisting of gallium oxide ($Ga_2O_3$), silicon (Si), silicon carbide (SiC), gallium nitride (GaN), aluminum oxide ($Al_2O_3$), germanium (Ge), carbon (C), aluminum nitride (AlN), zinc oxide (ZnO), gallium arsenide (GaAs), and aluminum gallium nitride (AlGaN). The device function layer has a thickness of 100 nm to 50 μm, and has an amorphous structure. The device function layer is planarized and smoothed such that its surface roughness is 0.1-10 nm, and the thickness after planarization and smoothing is 50 nm to 45 μm. Then annealing is performed to crystallize the device function layer.

Figure 3:
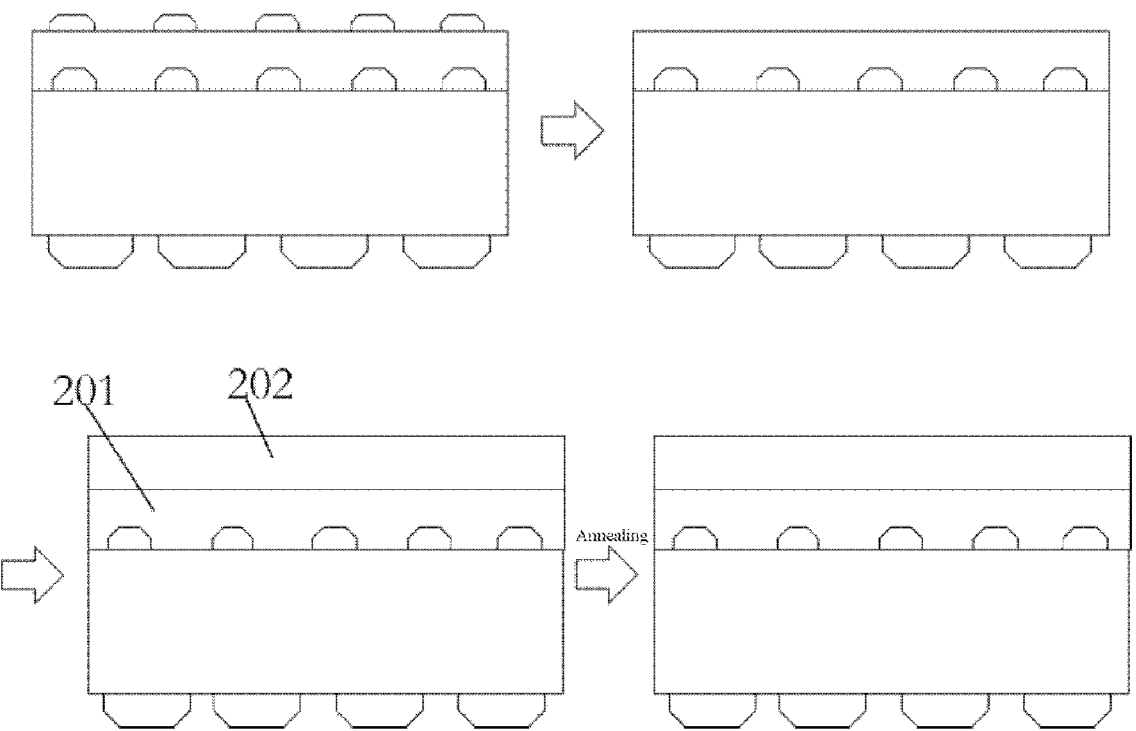
FIG. 3 is a flowchart of a preparation method of a multi-layer semiconductor material structure according to another embodiment.

In another embodiment of the present application, as shown in FIG. 3, in order to enhance the interfacial adsorption force, release stress and thermal conductivity, another multi-layer structure is adopted. The device function layer 2 includes a first film layer 201 and a second film layer 202. First, a highly thermally conductive support substrate 1 is provided, and the first film layer 201 is deposited on the first surface 101 of the highly thermally conductive support substrate 1. The first film layer 201 is a single-layer structure made of one of the group consisting of gallium oxide ($Ga_2O_3$), silicon (Si), silicon carbide (SiC), gallium nitride (GaN), aluminum oxide ($Al_2O_3$), germanium (Ge), carbon (C), aluminum nitride (AlN), zinc oxide (ZnO), gallium arsenide (GaAs), aluminum gallium nitride (AlGaN), silicon nitride (SiN), silicon dioxide ($SiO_2$), hafnium oxide ($HfO_2$), silicon oxynitride (SiNO), silicon oxycarbide (SiCO), and aluminum oxynitride (AlON), or a multi-layer structure formed by depositing more of the group separately. The first film layer 201 has a thickness of 100 nm to 50 μm, and has an amorphous structure. The first film layer is planarized and smoothed to a surface roughness of 0.1-50 nm. Then, the second film layer 202 is deposited and surface-smoothed. The second film layer 202 is a single-layer structure made of one of the group consisting of gallium oxide ($Ga_2O_3$), silicon (Si), silicon carbide (SiC), gallium nitride (GaN), aluminum oxide ($Al_2O_3$), germanium (Ge), carbon (C), aluminum nitride (AlN), zinc oxide (ZnO), gallium arsenide (GaAs), and aluminum gallium nitride (AlGaN), or a multi-layer structure formed by depositing more of the group separately. The second film layer has a thickness of 100 nm to 50 μm and a surface roughness of 0.1-10 nm. The second film layer is then annealed to crystallize. The crystallized thin structure has a microstructural gradient from single-crystal to poly-crystal from a surface to an interface, and a near-surface layer has a high-quality single-crystal structure and a fixed orientation, such as [0001], [001], [111], [110], etc.

Figure 4:
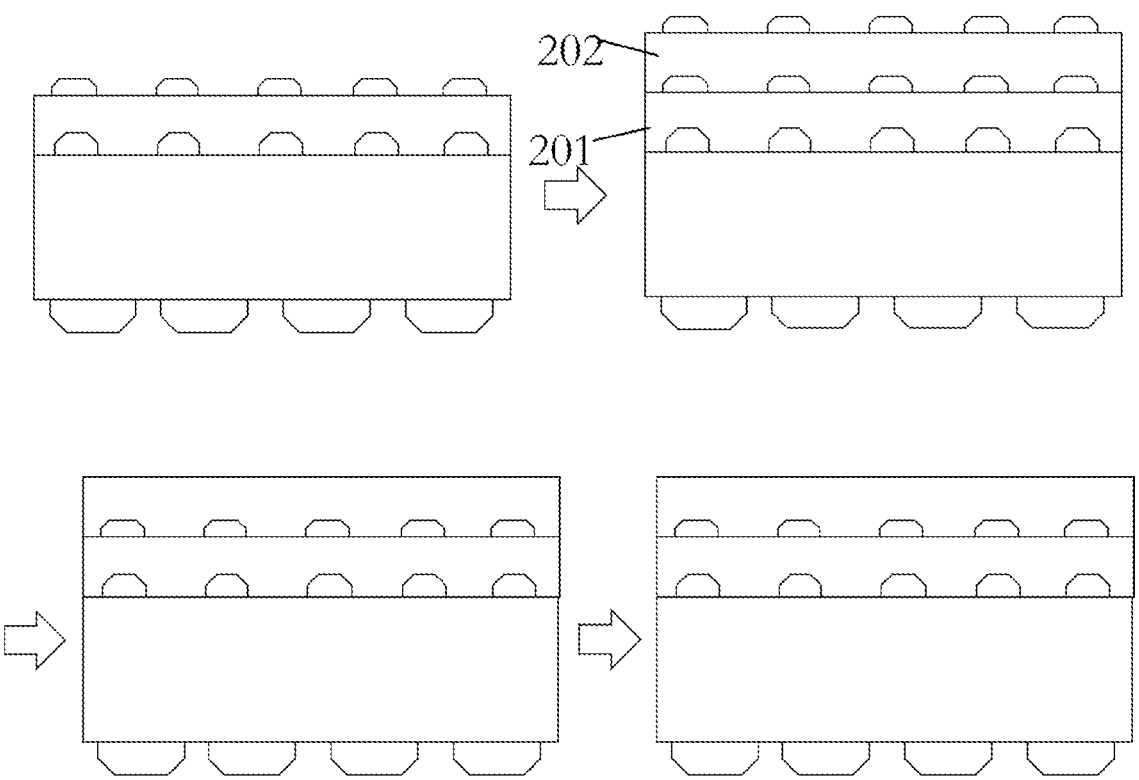
FIG. 4 is a flowchart of a preparation method of a multi-layer semiconductor material structure according to another embodiment.

In another embodiment of the present application, as shown in FIG. 4, similarly, the device function layer includes a first film layer 201 and a second film layer 202. After the first film layer 201 is deposited, the planarization and smoothing steps are omitted, and the second film layer 202 is directly deposited. The second film layer 202 is then planarized and smoothed.

Figure 6:
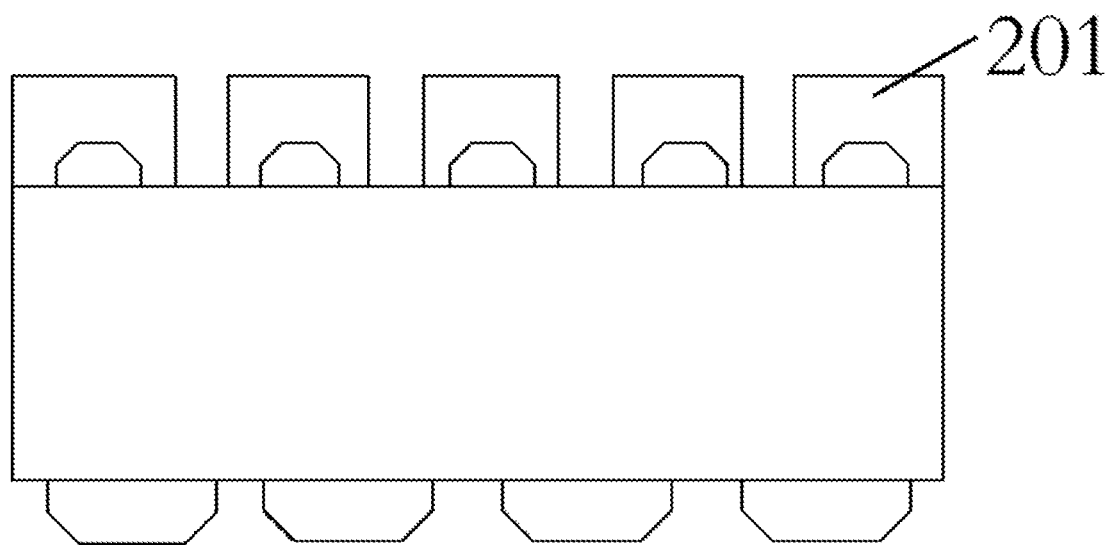
FIG. 6 is a sectional diagram of a multi-layer semiconductor material structure after patterning and etching.
Figure 7:
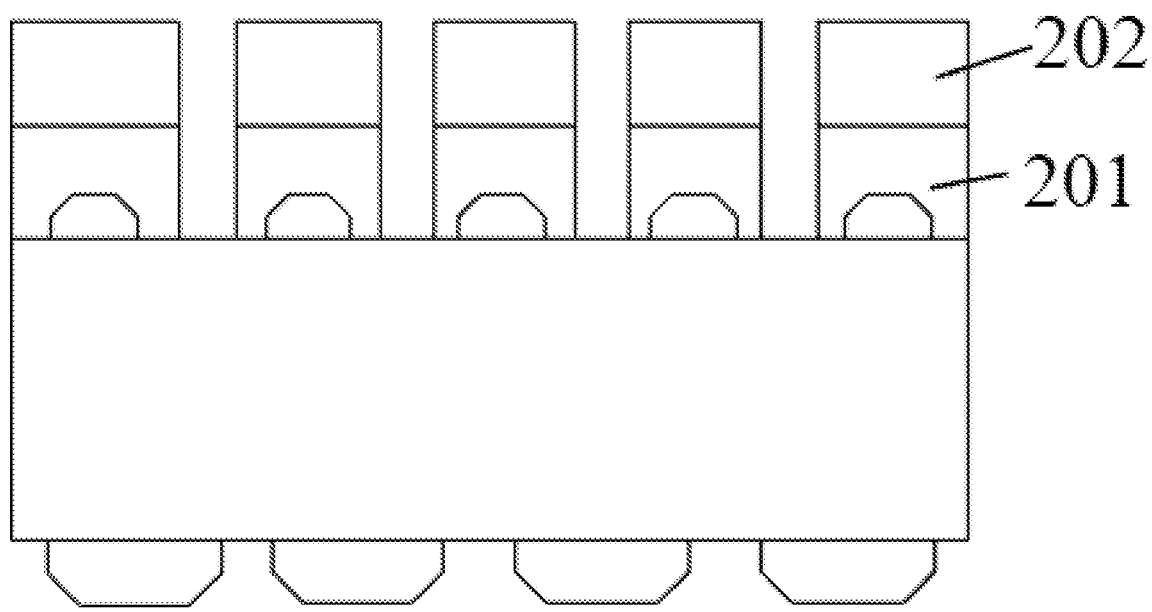
FIG. 7 is a sectional diagram of another multi-layer semiconductor material structure after patterning and etching.
Figure 8:
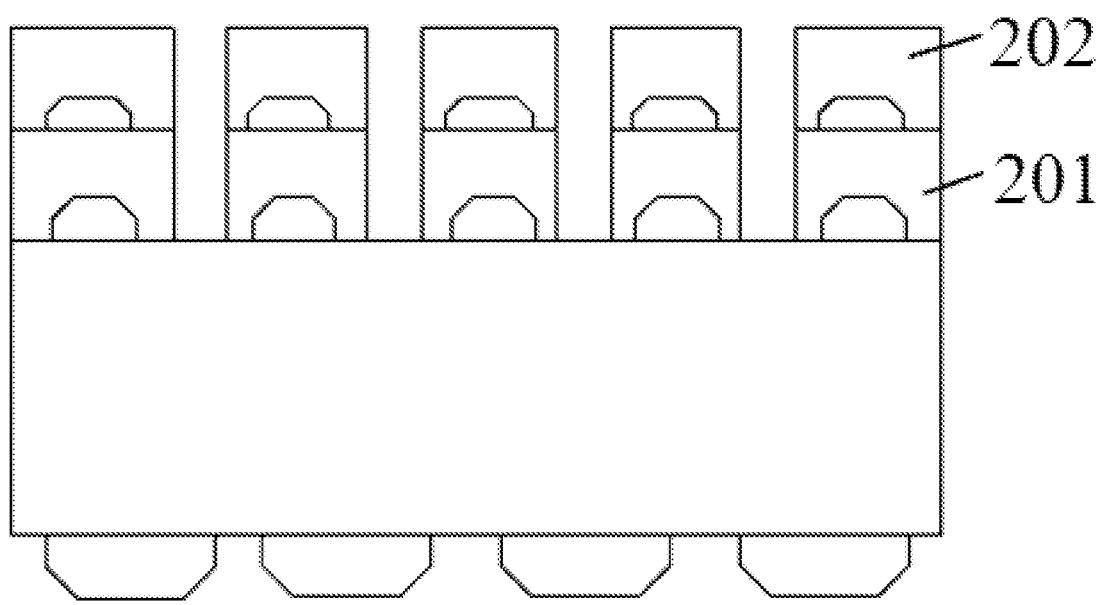
FIG. 8 is a sectional diagram of another multi-layer semiconductor material structure after patterning and etching.
Figure 9:
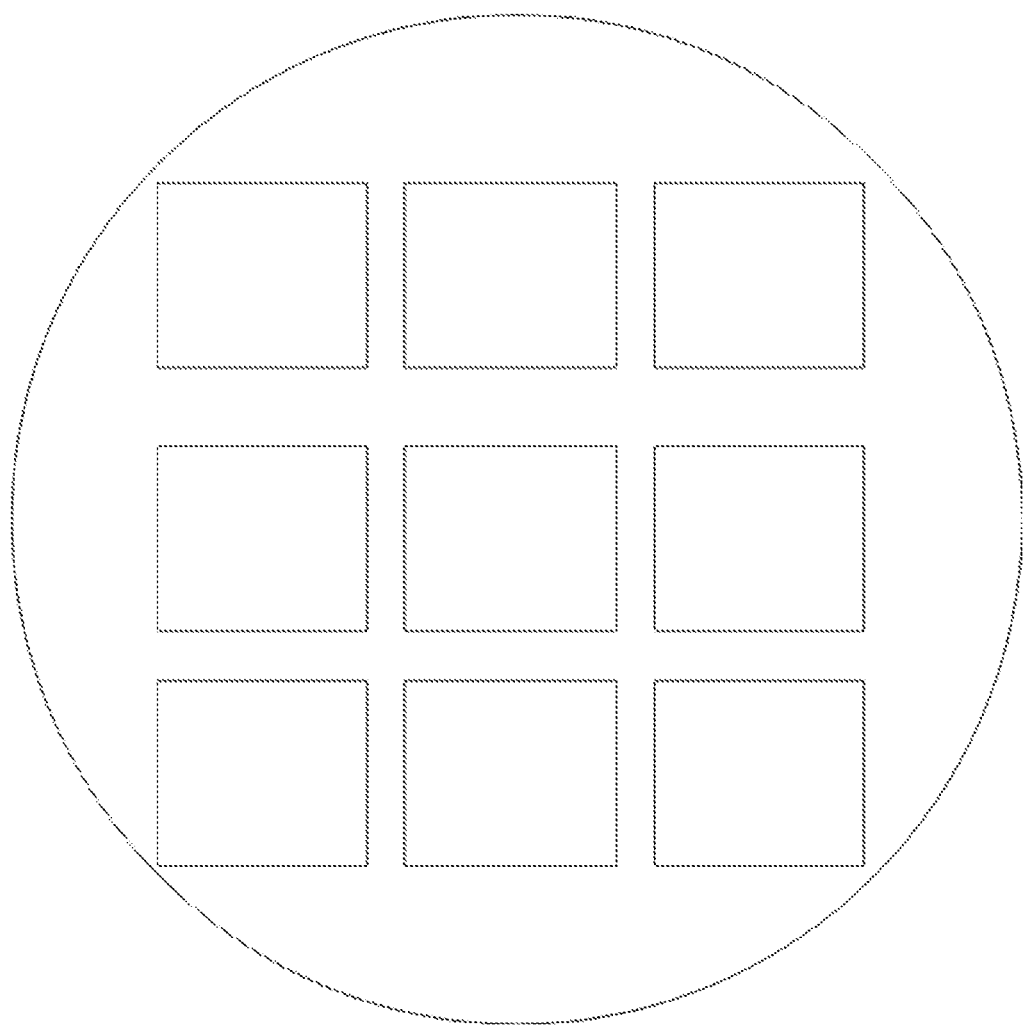
FIG. 9 is a plan view of a multi-layer semiconductor material structure after patterning and etching.

The prepared multi-layer semiconductor material structure may also have a patterned and etched structure from the above structure. Possible sections are shown in FIGS. 6 to 8. A possible plan view is shown in FIG. 9, but it is not limited to a circular substrate and square patches.

Embodiment 1

First, a highly thermally conductive support substrate 1 is provided, which is made of diamond and has a thickness of 100-200 μm. A first surface 101 has a roughness of 1 nm, and a second surface 102 has a roughness of 20 nm.

A gallium oxide ($Ga_2O_3$) layer is deposited on the highly thermally conductive support substrate 1 by means of CVD, and it has a thickness of 200 nm.

The gallium oxide ($Ga_2O_3$) layer is planarized and smoothed to a roughness of 0.5 nm.

A sapphire single-crystal substrate 3 is attached on the planarized and smoothed gallium oxide ($Ga_2O_3$) layer. The single-crystal substrate 3 has a thickness of 500 μm and a roughness of 0.3 nm. Then, heating and annealing are performed. Specifically, the temperature is raised to 600° C. at a rate of 1° C./min, held for 30 min, and dropped at a rate of 1° C./min. After cooling, the single-crystal substrate 3 is removed to obtain a multi-layer semiconductor material structure.

Embodiment 2

First, a highly thermally conductive support substrate 1 is provided, which is made of silicon carbide (SiC) and has a thickness 400 μm. A first surface 101 has a roughness of 0.3 nm, and a second surface 102 has a roughness of 10 nm.

An aluminum oxide ($Al_2O_3$) layer is deposited on the highly thermally conductive support substrate 1 by means of ALD, and it has a thickness of 100 nm.

A gallium oxide ($Ga_2O_3$) layer is deposited on the aluminum oxide ($Al_2O_3$) layer by means of CVD, and it has a thickness of 200 nm. The gallium oxide ($Ga_2O_3$) layer is planarized and smoothed to a roughness of 0.5 nm.

A single-crystal aluminum oxide ($Al_2O_3$) substrate is attached on the gallium oxide ($Ga_2O_3$) layer. The single-crystal substrate 3 has a thickness of 50 μm roughness of 0.3 nm. Then, heating and annealing are performed. Specifically, the temperature is raised to 600° C. at a rate of 1° C./min, held for 30 min, and dropped at a rate of 1° C./min. After cooling, the single-crystal substrate 3 is removed to obtain a multi-layer semiconductor material structure.

In the above description, the technical details such as the composition and etching of each layer are not described in detail. However, those skilled in the art should understand that layers and regions with desired shapes can be formed by various technical means. In addition, in order to form the same structure, those skilled in the art can also design a method that is not completely the same as the method described above. In addition, although the various embodiments are described above separately, this does not mean that the measures in the various embodiments cannot be used in combination.

The embodiments of the present application are described above. However, these embodiments are for illustrative purposes only, and are not intended to limit the scope of the present application. The scope of the present application is limited by the appended claims and legal equivalents thereof. Those skilled in the art can make various substitutions and modifications to the present application without departing from the scope of the present application, but such substitutions and modifications should all fall within the scope of the present application.

The invention claimed is:

1. A multi-layer semiconductor material structure, comprising:
   a highly thermally conductive support substrate, and
   a crystallized device function layer, which is provided on the highly thermally conductive support substrate, and has a single-crystal surface layer; wherein
   the device function layer has a crystal structure, with a single-crystal portion close to the surface and the interface, and a microstructural gradient from single-crystal to poly-crystal from the surface and the interface to a center.

2. The multi-layer semiconductor material structure according to claim 1, wherein the device function layer comprises a first film layer and a second film layer; the first film layer is provided on the highly thermally conductive support substrate; and the second film layer is provided on the first film layer;
   the first film layer is a single-layer structure made of one of the group consisting of gallium oxide, silicon, silicon carbide, GaN, aluminum oxide, germanium, carbon, AlN, ZnO, GaAs, AlGaN, SiN, SiO2, HfO2, SiNO, SiCO, and AlON; and the first film layer has a thickness of 100 nm to 50 µm; and
   the second film layer is a single-layer structure made of a multi-layer structure made of more of the group consisting of gallium oxide, silicon, silicon carbide, GaN, aluminum oxide, germanium, carbon, AlN, ZnO, GaAs, AlGaN; and the second film layer has a thickness of 100 nm to 50 µm.

3. The multi-layer semiconductor material structure according to claim 1, wherein the device function layer comprises a first film layer and a second film layer;
   the first film layer is provided on the highly thermally conductive support substrate; and the second film layer is provided on the first film layer;
   the first film layer is a single-layer structure made of a multi-layer structure made of at least one selected from the group consisting of gallium oxide, silicon, silicon carbide, GaN, aluminum oxide, germanium, carbon, AlN, ZnO, GaAs, AlGaN, SiN, SiO2, HfO2, SiNO, SiCO, and AlON;
   the first film layer has a thickness of 100 nm to 50 µm; and
   the second film layer is a single-layer structure made of one selected from the group consisting of gallium oxide, silicon, silicon carbide, GaN, aluminum oxide, germanium, carbon, AlN, ZnO, GaAs, AlGaN; and the second film layer has a thickness of 100 nm to 50 µm.

4. The multi-layer semiconductor material structure according to claim 1, wherein the device function layer comprises a first film layer and a second film layer;
   the first film layer is provided on the highly thermally conductive support substrate; and the second film layer is provided on the first film layer;
   the first film layer is a single-layer structure made of a multi-layer structure made of at least one selected from the group consisting of gallium oxide, silicon, silicon carbide, GaN, aluminum oxide, germanium, carbon, AlN, ZnO, GaAs, AlGaN, SiN, SiO2, HfO2, SiNO, SiCO, and AlON;
   the first film layer has a thickness of 100 nm to 50 µm; and
   the second film layer is a single-layer structure made of a multi-layer structure made of at least one selected from the group consisting of gallium oxide, silicon, silicon carbide, GaN, aluminum oxide, germanium, carbon, AlN, ZnO, GaAs, AlGaN; and the second film layer has a thickness of 100 nm to 50 µm.

5. A multi-layer semiconductor material structure, comprising:
   a highly thermally conductive support substrate, and
   a crystallized device function layer comprising a single-crystal surface layer, wherein
   the crystallized device function layer is provided on the highly thermally conductive support substrate, wherein
   the crystallized device function layer has a crystal structure, with a microstructural gradient from single-crystal to poly-crystal from a surface to an interface;
   or
   the crystallized device function layer has a crystal structure, with a single-crystal portion close to the surface and the interface, and a microstructural gradient from single-crystal to poly-crystal from the surface and the interface to a center.

6. The multi-layer semiconductor material structure of claim 5, wherein the device function layer is a single-layer structure comprises at least one selected from the group consisting of gallium oxide, silicon, silicon carbide, GaN, aluminum oxide, germanium, carbon, AlN, ZnO, GaAs, AlGaN, and has a thickness of 100 nm to 50 µm.

7. The multi-layer semiconductor material structure according to claim 5, wherein the device function layer comprises a first film layer and a second film layer; the first film layer is provided on the highly thermally conductive support substrate; and the second film layer is provided on the first film layer;
   the first film layer is a single-layer structure made of one selected from the group consisting of gallium oxide, silicon, silicon carbide, GaN, aluminum oxide, germanium, carbon, AlN, ZnO, GaAs, AlGaN, SiN, SiO2, HfO2, SiNO, SiCO, and AlON; and the first film layer has a thickness of 100 nm to 50 µm; and
   the second film layer is a single-layer structure made of a multi-layer structure made of at least one selected from the group consisting of gallium oxide, silicon, silicon carbide, GaN, aluminum oxide, germanium, carbon, AlN, ZnO, GaAs, AlGaN; and the second film layer has a thickness of 100 nm to 50 µm.

8. The multi-layer semiconductor material structure according to claim 5, wherein the highly thermally conductive support substrate comprises at least one selected from the group consisting of diamond, SiC, AlN, BN, BeO, AlSiC, CuW, and CuMo.

9. The multi-layer semiconductor material structure according to claim 5, wherein the device function layer comprises a first film layer and a second film layer; the first film layer is provided on the highly thermally conductive support substrate; and the second film layer is provided on the first film layer;

the first film layer is a single-layer structure made of a multi-layer structure made of at least one selected from the group consisting of gallium oxide, silicon, silicon carbide, GaN, aluminum oxide, germanium, carbon, AlN, ZnO, GaAs, AlGaN, SiN, SiO2, HfO2, SiNO, SiCO, and AlON; and the first film layer has a thickness of 100 nm to 50 μm; and the second film layer is a single-layer structure made of one selected from the group consisting of gallium oxide, silicon, silicon carbide, GaN, aluminum oxide, germanium, carbon, AlN, ZnO, GaAs, AlGaN; and the second film layer has a thickness of 100 nm to 50 μm.

10. The multi-layer semiconductor material structure according to claim 5, wherein the device function layer comprises a first film layer and a second film layer; wherein the first film layer is provided on the highly thermally conductive support substrate; and the second film layer is provided on the first film layer;

the first film layer is a single-layer structure made of a multi-layer structure made of at least one selected from the group consisting of gallium oxide, silicon, silicon carbide, GaN, aluminum oxide, germanium, carbon, AlN, ZnO, GaAs, AlGaN, SiN, SiO2, HfO2, SiNO, SiCO, and AlON; and the first film layer has a thickness of 100 nm to 50 μm; and the second film layer is a single-layer structure made of a multi-layer structure made of at least one selected from the group consisting of gallium oxide, silicon, silicon carbide, GaN, aluminum oxide, germanium, carbon, AlN, ZnO, GaAs, AlGaN; and the second film layer has a thickness of 100 nm to 50 μm.

11. The multi-layer semiconductor material structure according to claim 5, wherein the device function layer comprises a first film layer and a second film layer; wherein the first film layer is provided on the highly thermally conductive support substrate; and the second film layer is provided on the first film layer; wherein the first film layer is a single-layer structure made of a multi-layer structure comprising at least one selected from the group consisting of gallium oxide, silicon, silicon carbide, GaN, aluminum oxide, germanium, carbon, AlN, ZnO, GaAs, AlGaN, SiN, SiO2, HfO2, SiNO, SiCO, and AlON; and the first film layer has a thickness within the range of 100 nm to 50 μm; and wherein the second film layer is a single-layer structure comprises at least one selected from the group consisting of gallium oxide, silicon, silicon carbide, GaN, aluminum oxide, germanium, carbon, AlN, ZnO, GaAs, AlGaN; and the second film layer has a thickness within the range of 100 nm to 50 μm.

12. A method of preparing a multi-layer semiconductor material structure, comprising:

forming a device function layer on a highly thermally conductive support substrate;

attaching a single-crystal substrate to a surface of the device function layer;

annealing at 300-1,800° C.; and lifting the single-crystal substrate off after cooling to obtain the multi-layer semiconductor material structure.

13. The method of claim 12, wherein the device function layer is formed on the highly thermally conductive support substrate by at least one of chemical vapor deposition, atomic layer deposition, molecular beam deposition, HVPE, physical sputtering, and plasma-enhanced chemical vapor deposition.

14. The method of claim 12, wherein the device function layer comprises a first film layer and a second film layer; and wherein forming a device function layer comprises:

depositing the first film layer with a thickness within the range of 100 nm to 50 μm on the highly thermally conductive support substrate;

planarizing and smoothing the first film layer; and depositing the second film layer with a thickness within the range of 100 nm to 50 μm.

15. The method of claim 12, wherein the device function layer is a single film layer with a thickness within the range of 100-50 μm; and the preparation method further comprises: planarizing and smoothing the film layer after forming the film layer on the highly thermally conductive support substrate and attaching a single-crystal substrate to a surface of the smoothed film layer.

16. The method of claim 12, wherein the device function layer is planarized and smoothed to a surface roughness within the range of 0.1-10 nm.

* * * * *